United States Patent [19]
Kerber

[11] Patent Number: 6,027,972
[45] Date of Patent: Feb. 22, 2000

[54] METHOD FOR PRODUCING VERY SMALL STRUCTURAL WIDTHS ON A SEMICONDUCTOR SUBSTRATE

[75] Inventor: Martin Kerber, München, Germany

[73] Assignee: Siemens Aktiengesellschaft, Munich, Germany

[21] Appl. No.: 09/044,533

[22] Filed: Mar. 19, 1998

Related U.S. Application Data

[63] Continuation of application No. PCT/DE96/01697, Sep. 10, 1996.

[30] Foreign Application Priority Data

Sep. 19, 1995 [DE] Germany ............... 195 34 780

[51] Int. Cl.[7] ............................................. H01L 21/336
[52] U.S. Cl. ..................... 438/257; 438/259; 438/264
[58] Field of Search .................................. 438/257, 259, 438/263, 264

[56] References Cited

U.S. PATENT DOCUMENTS

| | | | |
|---|---|---|---|
| 4,513,397 | 4/1985 | Ipri et al. . | |
| 4,558,339 | 12/1985 | Angle . | |
| 5,100,818 | 3/1992 | Arima et al. ............... | 438/257 |
| 5,225,362 | 7/1993 | Bergemont . | |
| 5,310,693 | 5/1994 | Hsue . | |
| 5,612,237 | 3/1997 | Ahn ............................. | 438/257 |
| 5,750,428 | 5/1998 | Chang ......................... | 438/264 |
| 5,773,343 | 6/1998 | Lee et al. .................... | 438/259 |
| 5,817,557 | 10/1998 | Baldi ........................... | 438/264 |
| 5,837,583 | 11/1998 | Chuang et al. ............. | 438/257 |
| 5,854,501 | 12/1998 | Kao ............................. | 438/259 |

FOREIGN PATENT DOCUMENTS

| | | |
|---|---|---|
| 0 197 284 A2 | 10/1986 | European Pat. Off. . |
| 5-190809 | 7/1993 | Japan . |

OTHER PUBLICATIONS

"Double Trans Isolation (DTI): A Novel Isolation Technology for Deep–Submicron Silicon Devices" (Park et al.), Advanced Technology Center, Samsung Electronics Co. LTD, Korea, pp. 137–138.

"Low–power EE–PROM can be reprogrammed fast" Technical Articles, Electronics, Jul. 31, 1980, pp. 89–92.

"Deep Dielectric Isolationi" (S.D. Malaviya), Technical Disclosure Bulletin, vol. 26, No. 7A, Dec. 1983, pp. 3188–3189.

"Submicron–gate self–aligned gallium arsenide fet fabrication", IBM Technical Disclosure Bulletin, vol. 28, No. 6, Nov. 1985.

*Primary Examiner*—John F. Niebling
*Assistant Examiner*—Walter Lindsay, Jr.
*Attorney, Agent, or Firm*—Herbert L. Lerner; Laurence A. Greenberg

[57] ABSTRACT

Very narrow structures are produced on a semiconductor substrate. A first layer deposited over an edge of a structure is anisotropically etched back. The spacer at the edge of the structure which remains after the first layer and the structure are removed, after further deposition and etching steps, finally defines the position and width of the resulting microstructure. The very narrow structure may be the channel width of a flash memory cell.

6 Claims, 3 Drawing Sheets

METHOD FOR PRODUCING VERY SMALL STRUCTURAL WIDTHS ON A SEMICONDUCTOR SUBSTRATE

CROSS-REFERENCE TO RELATED APPLICATION

This is a continuation of copending international application PCT/DE96/01697, filed Sep. 10, 1996, which designated the United States.

BACKGROUND OF THE INVENTION

Field of the Invention

In integrated MOS circuits, those transistors with a minimal gate length are used as drivers, and transistors with a minimal width are used as active load elements. For load elements, the transistor width has a direct effect on the gate capacitance, which forms a capacitive load for the preceding stage, and the resistance value for an active load element. In prior art methods for producing integrated MOS circuits, the minimal transistor width is determined by the minimal active bulk width in the production of the field insulation by means of a LOCOS (Local Oxidation of Silicon) process. In a certain lithography generation, this is normally about one and a half to two times more than the minimal gate length.

A smaller transistor width is desired, however, since this has a positive effect on the transistor area, gate area and hence gate oxide yield and also on the input capacitance of the active load elements.

The cells of non-volatile memories such as FLOTOX EEPROMs or flash memories are also formed by MOS transistors, i.e., by elements having a source region, a channel region, and a drain region. The information is stored in such memory cells in a floating gate above the channel region, which is insulated from the latter by a gate oxide. This charge is changed by programming or erasure as a result of Fowler-Nordheim tunneling of electrons between the floating gate and the semiconductor substrate through a very thin dielectric, which is formed by a very thin window, the tunneling window, in the gate oxide. The requisite voltage, corresponding to a field strength of more than 10 MV/cm, is coupled in capacitively through a control gate.

The voltage across the control gate which is required for initiating the tunneling process depends on two factors: first, the efficiency with which the voltage applied to the control gate is coupled in, in other words on the coupling factor which is essentially determined by the ratio between the area of the control gate and the area of the tunneling window, and, second, on the thickness of the tunnel oxide.

A minimum programming voltage requires a small tunneling window with a thin tunnel oxide while calling for maximum overlap of the control gate over the floating gate.

Tunneling takes place in flash memory cells in a region of overlap between the floating gate and the drain region. Thinned oxide portions arise at the field oxide edges during the production of the gate oxide by thermal oxidation of the gate regions in the field oxide produced by means of a LOCOS process. The thinned oxide portions lead to non-homogeneous current injection and to reduced oxide reliability. These process-induced thinned portions must be prevented by a correspondingly thicker nominal tunnel oxide. In addition, the oxide thickness in the case of ultra-thin oxides is downwardly limited due to the occurrence of "anomalous gate leakage currents" after Fowler-Nordheim injection.

Accordingly, it is primarily necessary to reduce the size of the tunneling window in order to reduce the programming voltage, and in order to achieve a high coupling factor.

This may be done in two ways. On the one hand by reducing the region of overlap and on the other hand by reducing the channel width. The field insulation is usually effective by means of a LOCOS process, with the result that the channel width has a lower limit imposed on it by the structural resolution of the photolithographic process.

Tunneling in EEPROM memory cells takes place via a tunneling window in the gate oxide overlying the channel region. In this case, too, the dimensions of the window are limited by the structural resolution of the photolithography.

The Japanese disclosure JP 5-190809 A2 discloses the use of a spacer technology to etch mutually insulated trenches into an oxide-polysilicon-oxide-polysilicon layer structure applied to a semiconductor substrate, with the result that the width of the trenches becomes very small and the remaining structures constitute stacked gates with a high packing density. However, the dimension of the gate electrodes is in this case not influenced by the spacer technology.

The paper 28 IBM Technical Disclosure Bulletin, No. 6, November 1985, discloses the production of a GaAs FET having a gate electrode with a very short length. The length is determined by a spacer technology. However, the gate electrode is in direct contact with the channel region, thereby producing a Schottky contact. Moreover, a special layer structure is used to produce the Schottky gate electrode and it cannot easily be transferred to silicon MOS technology.

SUMMARY OF THE INVENTION

It is accordingly an object of the invention to provide a method of producing very small structural widths on a semiconductor substrate, which overcomes the above-mentioned disadvantages of the prior art methods of this general type and wherein widths of the structures are not limited by the photolithographic process.

With the foregoing and other objects in view there is provided, in accordance with the invention, a method of producing a very small tunnel window in an EEPROM memory cell, which comprises the following steps:

a) providing a substrate with a surface and producing on the surface an oxide layer with field oxide regions and at least one gate oxide region between the field oxide regions;

b) producing a silicon nitride layer on the oxide layer;

c) producing a polysilicon layer on the silicon nitride layer;

d) producing a structure on the polysilicon layer, wherein one edge of the structure lies above the gate oxide region;

e) depositing a layer (e.g. silicon nitride) over the polysilicon layer and the structure, whereby the layer is etchable selectively with respect to the polysilicon layer;

f) etching the layer anisotropically and forming a microstructure on the edge of the structure above the gate oxide region;

g) removing the structure;

h) forming an oxide layer on the polysilicon layer around the microstructure, and with the microstructure acting as an oxide barrier;

i) removing the microstructure;

j) anisotropically etching the polysilicon layer underneath the oxide layer, with the oxide layer acting as an etching mask;

k) removing the oxide layer;

l) anisotropically etching the silicon nitride layer underneath the polysilicon layer, with the polysilicon layer acting as an etching mask;

m) removing the polysilicon layer;

n) anisotropically etching the gate oxide layer underneath the silicon nitride layer down to the substrate surface, with the silicon nitride layer acting as an etching mask, and forming a tunnel window with walls;

o) thermally oxidizing the exposed substrate surface and the walls of the tunnel window; and p) removing the silicon nitride layer.

With the above and other objects in view there is also provided, in accordance with the invention, a method of producing a gate electrode having a very small width, which comprising the following steps:

a) producing a silicon oxide-polysilicon-silicon oxide layer sandwich on a substrate surface;

b) producing a first layer on the layer sandwich;

c) producing a structure with an edge on the first layer;

d) depositing a second layer over the first layer and the structure, wherein the second layer is etchable selectively with respect to the first layer;

e) anisotropically etching the second layer and leaving only a microstructure at the edge of the structure;

f) removing the structure;

g) forming an oxide layer on the first layer around the microstructure, with the microstructure acting as an oxide barrier;

h) removing the microstructure;

i) anisotropically etching the first layer underneath the oxide, and using the oxide layer structured by means of the microstructure as an etching mask;

j) removing the oxide layer;

k) anisotropically etching the upper silicon oxide layer of the layer sandwich underneath the first layer, and using the first layer as an etching mask;

l) removing the first layer;

m) anisotropically etching the polysilicon layer and the silicon oxide layer of the layer sandwich down to the substrate surface, using the upper silicon oxide layer as an etching mask, and forming a trench with wall surfaces;

n) thermally oxidizing the substrate surface and the wall surfaces of the trench; and o) filling and covering the trench with a polysilicon layer that reaches into the trench and forms a gate electrode.

In other words, a structure is first formed with an edge at the point at which the very narrow structure is to be produced. The first layer which is then produced covers the entire surface, including the edge. This first layer is subsequently anisotropically etched back until the horizontal portions of the layer are completely removed. In the process, a residue remains at the edge, the width of which is approximately equal to the thickness of the deposited layer. This residue is usually referred to as a spacer. The material of the structure is selected in such a way that it can be etched selectively with respect to the material of the first layer. After that etching process, only the residue of the first layer, the spacer, remains. This forms an oxidation barrier when the layer underneath is subsequently oxidized. In other words, only the region outside the spacer is oxidized.

After the removal of the spacer, whereby the materials are to be selected in such a way that the material of the spacer, i.e., the material of the first layer, can be etched selectively with respect to the second layer situated underneath and with respect to the previously produced oxide layer, a small line-type structure width corresponding to the dimensions of the spacer is preserved in the oxide layer. The oxide layer can thus be used as an etching mask for the second layer situated underneath.

During anisotropic etching, the layer situated underneath is etched only down into its depth, with the result that it can be used as an etching mask, following the removal of the oxide layer, for a layer situated underneath the latter.

Successive layers can each be etched selectively according to the invention, whereby the respective upper layer can be used as an etching mask for the layer underneath. The structure width is preserved during anisotropic etching and corresponds approximately to the thickness of the first layer. The first layer and, specifically its thickness, of course, is readily reproducible and it can be selected to be smaller than the structure resolution of prior optical lithographic techniques.

Preferred materials are silicon nitride for the first layer and polysilicon for the second layer. These can readily be etched selectively with respect to one another and also with respect to silicon oxide. The structure forming the edge is preferably formed using TEOS (tetraethyl orthosilicate).

As noted above, the invention is applicable both to field isolation by means of a LOCOS process and to a silicon oxide-polysilicon-silicon oxide sandwich insulation layer. In the first case, it is necessary to deposit a layer between the oxide layer and the second layer which allows selective etching of silicon oxide. In accordance with an added feature of the invention, therefore, the first layer is a polysilicon layer and the second layer is a silicon nitride layer.

In accordance with another feature of the invention, the gate electrode is a control electrode in a MOS transistor.

In accordance with a concomitant feature of the invention, the gate electrode is a floating gate in a flash EEPROM memory cell.

The small structure width which can be attained by the method according to the invention is very advantageously employed in the production of extremely narrow gates in MOS transistors for forming active load elements, and in the production of very small tunneling windows in FLOTOX EEPROM memory cells, as well as very small channel widths in flash memory cells.

Other features which are considered as characteristic for the invention are set forth in the appended claims.

Although the invention is illustrated and described herein as embodied in method for producing very small structural widths on a semiconductor substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
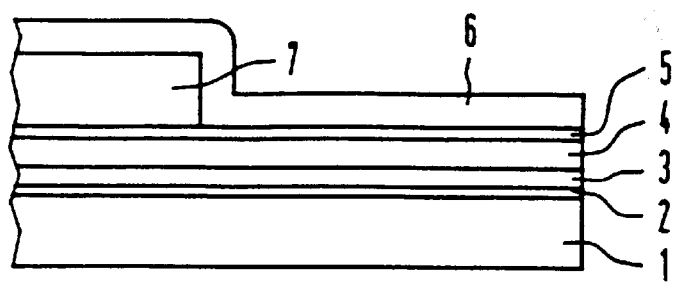
FIGS. 1A to 1H are diagrammatic views illustrating the novel process sequence of a method of producing a narrow structure in an oxide-polysilicon-oxide sandwich insulation.
Figure 1B:
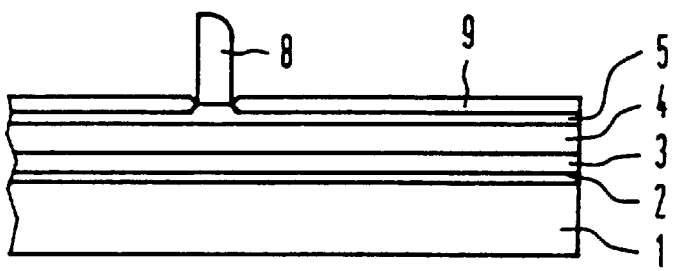

Referring now to the figures of the drawing in detail and first, particularly, to FIGS. 1A and 1B thereof, there are seen the individual steps of a process for producing a small structure width on a semiconductor substrate. Identical layers have identical reference symbols.

A thin oxide layer 2 has been produced on a semiconductor substrate 1. A doped polysilicon (poly-Si) layer 3 has been deposited on the thin oxide layer 2 and an oxide layer 4 has been formed on the polysilicon layer 3. Another polysilicon layer 5 has been deposited above the oxide-polysilicon-oxide insulation layer sandwich 2, 3, 4. A TEOS layer has been deposited over the upper polysilicon layer and structured by means of photolithography, thereby producing a structure 7 with a steep edge. A silicon nitride layer 6 has been deposited over this structure 7 and the free area of the polysilicon layer 5. The resulting configuration is illustrated in FIG. 1A.

Next, the silicon nitride layer 6 is anisotropically etched back. This leaves a residue 8—a so-called spacer—of the silicon nitride layer 6 only at the edge of the structure 7.

The structure 7 is subsequently removed and the polysilicon layer 5 situated underneath is oxidized. The spacer 8 left behind at the edge of the structure 7 acts as an oxidation barrier. The polysilicon layer 5 is thus oxidized only around the spacer and an oxide layer 9 is formed outside the spacer region 8. The resulting configuration is illustrated in FIG. 1B.

Next, the spacer 8 is removed. The etching step thus must be selective to the spacer without attacking the silicon oxide and the polysilicon. This condition is met by using silicon nitride for the first layer. However, other materials can also be used, the essential feature being that they can be etched selectively with respect to one another.

Figure 1C:
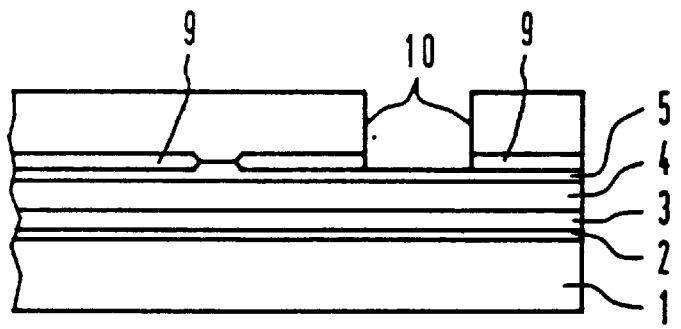
Figure 1D:
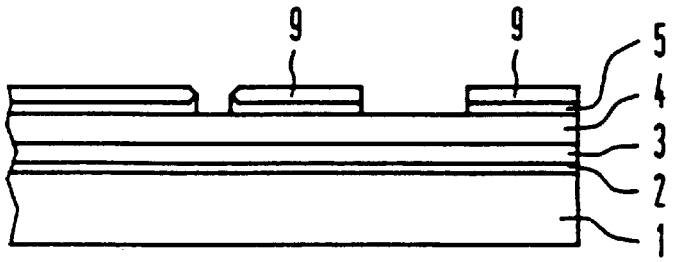

Referring now to FIG. 1C, there is illustrated the otherwise conventional production of a further structure by means of a photomask 10 at the same time as the small structure width is produced. The photomask 10 is used for etching regions in the silicon oxide layer 9. The photomask 10 is subsequently removed and the polysilicon 5 situated underneath is anisotropically etched with the oxide layer 9 serving as an etching mask. The result is illustrated in FIG. 1D.

Figure 1E:
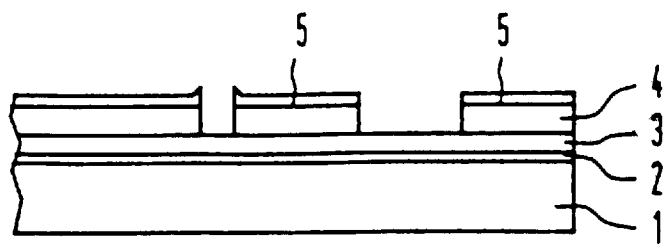

With reference to FIG. 1E, the silicon oxide 9 is next anisotropically etched. The oxide layer 4 is simultaneously structured.

Figure 1F:
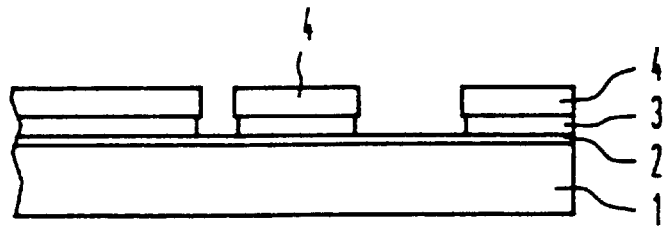

The polysilicon layer 5 is subsequently anisotropically etched, as a result of which the polysilicon layer 3 is simultaneously structured. The result is illustrated in FIG. 1F.

Figure 1G:
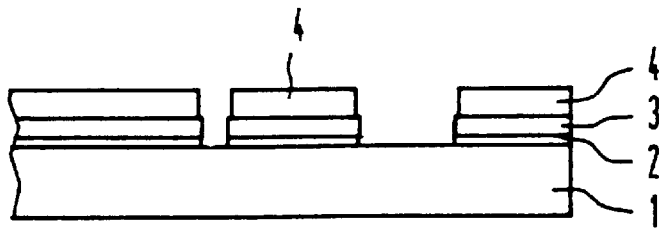
Figure 1H:
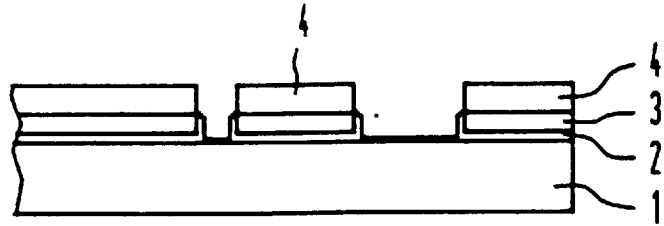

With reference to FIG. 1G, the thin oxide layer 2 is then etched, as a result of which the upper oxide layer 4 is also etched. As is illustrated in FIG. 1H, the exposed semiconductor substrate 1 is subsequently thermally oxidized to a desired oxide thickness. As a result, the previously exposed edges of the polysilicon layer 2 are also covered with an oxide and thus insulated.

With reference to FIG. 1H, there is shown a "normal" structure width on the right, such as can be produced by a conventional photolithographic step, and a very small structure width on the left, such as can be realized by the method according to the invention.

Figure 3:
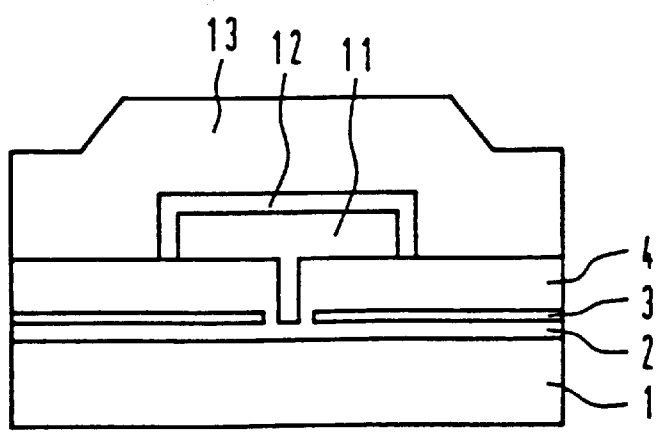
FIG. 3 is a sectional view taken through a flash memory cell having a narrow channel according to the invention in an oxide-polysilicon-oxide sandwich insulation layer.

The small structure width may be, for example, the cross-section through the channel of a flash memory cell. For this purpose, it is necessary—as illustrated in FIG. 3—to apply a conductive layer 11 as the floating gate, over which a further conductive layer 13, isolated by an insulation layer 12, is deposited as the control gate. The small structure width enables the production of a very narrow tunnel region, as a result of which a favorable coupling factor is possible which in turn permits a smaller programming and/or erase voltage. In addition, the memory cell becomes smaller as a result of the smaller channel width.

The small structural width can also be utilized in the context of "normal" MOS transistors which are used as active load elements. The novel process enables the production of transistors with a very small width, a small gate area and, consequently, a small gate capacitance.

Referring now to FIGS. 2A to 2F, there is shown the application of the novel method in the context of field oxide insulation, which is customary, for example, in FLOTOX EEPROM memory cells.

The floating gate of FLOTOX EEPROM memory cells is isolated from the channel region by a thin gate oxide. In order to attain smaller programming and erase voltages, it is necessary to produce a small tunneling window which is situated in this gate oxide and whose oxide thickness should be thinner than the gate oxide. The individual steps for producing this small tunneling window are illustrated in FIGS. 2A to 2F.

Figure 2A:
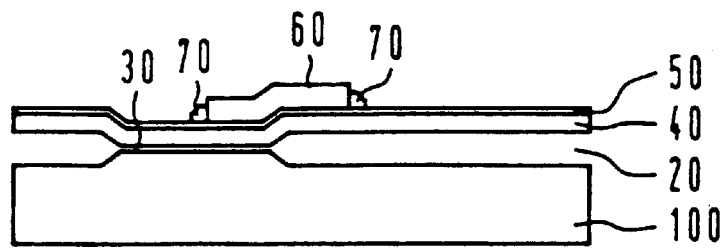
FIGS. 2A to 2F are diagrammatic views illustrating the novel sequence of a method of producing a narrow structure in field insulation by means of a LOCOS process.

In FIG. 2A, a field oxide 20 has been structured on a semiconductor substrate 100 by means of a LOCOS process and a gate oxide 30 has been produced. A silicon nitride layer 40 has been deposited on the latter and, in turn, a polysilicon layer 50 has been deposited on the silicon nitride layer. A TEOS layer has been deposited on the polysilicon layer 50 and structured by means of conventional photolithography to produce a structure 60. A silicon nitride layer has been deposited over this structure 60 and the polysilicon layer 50 and has subsequently been anisotropically etched back, with the result that spacers 70 remain at the edges of the structure 60. The result is illustrated in FIG. 2A.

Figure 2B:
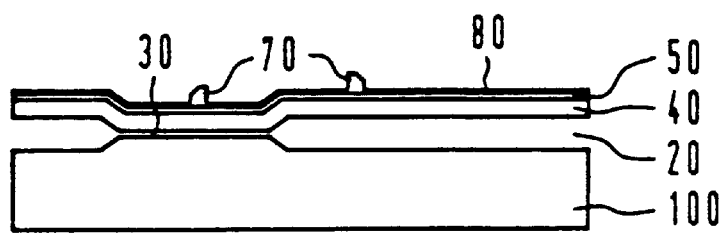
Figure 2C:
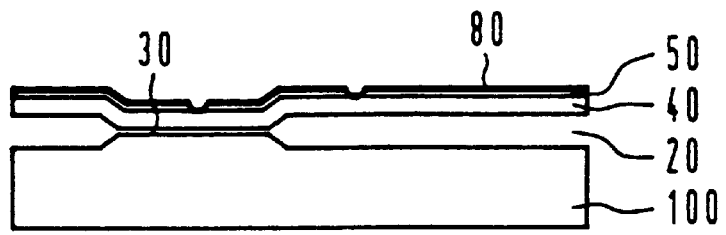

After the selective removal of the structure 60, the polysilicon layer 50 is oxidized, with the result that an oxide layer 80 is produced, as illustrated in FIG. 2B, around the spacer 70. The oxide layer 80 acts as oxidation barrier. After the removal of the spacer 70, the oxide layer 80 is used as an etching mask for the polysilicon layer 50 situated underneath. The result is shown in FIG. 2C.

The oxide layer 80 is subsequently removed and the polysilicon layer 50 situated underneath is used as an etching mask for the silicon nitride layer 40 situated underneath the latter.

Figure 2D:
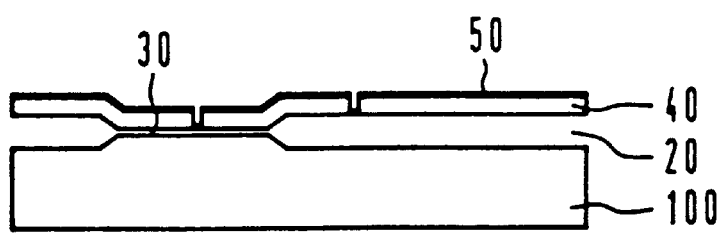

The silicon nitride layer 40 is required to prevent the field oxide and the gate oxide from also being attacked during the removal of the oxide layer 80. FIG. 2D shows the structure with the structured silicon nitride layer 40.

Figure 2E:
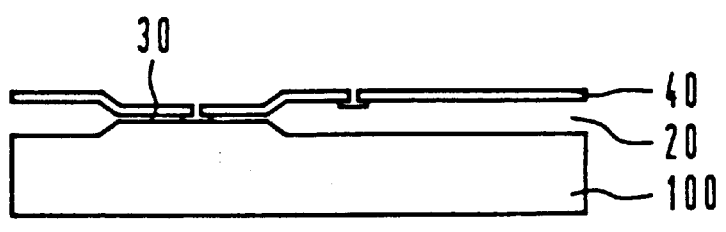

The polysilicon layer 50 is subsequently removed and the gate oxide is etched back to the semiconductor substrate 100 with the silicon nitride layer 40 serving as an etching mask. The result is illustrated in FIG. 2E.

Figure 2F:
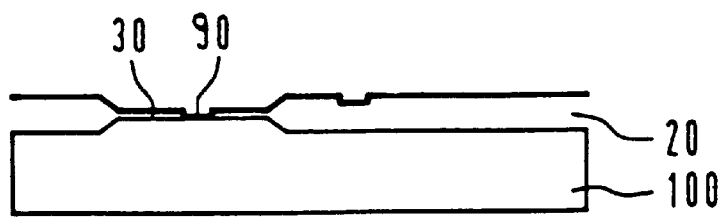

The silicon nitride layer 40 is subsequently removed and a thin tunnel oxide is produced by thermal oxidation in the small structure width 90 produced with the novel process. The small structure width 90 represents the tunneling window. The resultant structure is illustrated in FIG. 2F.

Since the spacer 70 according to FIG. 2A is produced at the edge of a structure 60, the trench forming the small structure width is always present in the form of a closed ring. In a FLOTOX EEPROM memory cell array this ring can always define the tunneling window of two mirror-symmetrical memory cells.

If the ring is to be opened then a further phototechnology step is necessary, by which the nitride web can be structured directly before the oxidation of the polysilicon layer 50.

The above-described process allows tunneling windows to be produced in extremely narrow strips. Their area is smaller by up to a factor of 10 as compared to those produced using conventional prior art technology.

I claim:

1. A method of producing a very small tunnel window in an EEPROM memory cell, which comprises the following steps:
   a) providing a substrate with a surface and producing on the surface an oxide layer with field oxide regions and at least one gate oxide region between the field oxide regions;
   b) producing a silicon nitride layer on the oxide layer;
   c) producing a polysilicon layer on the silicon nitride layer;
   d) producing a structure on the polysilicon layer, wherein one edge of the structure lies above the gate oxide region;
   e) depositing a layer over the polysilicon layer and the structure which is etchable selectively with respect to the polysilicon layer;
   f) etching the layer anisotropically and forming a microstructure on the edge of the structure above the gate oxide region;
   g) removing the structure;
   h) forming an oxide layer on the polysilicon layer around the microstructure, and with the microstructure acting as an oxide barrier;
   i) removing the microstructure;
   j) anisotropically etching the polysilicon layer underneath the oxide layer, with the oxide layer acting as an etching mask;
   k) removing the oxide layer;
   l) anisotropically etching the silicon nitride layer underneath the polysilicon layer, with the polysilicon layer acting as an etching mask;
   m) removing the polysilicon layer;
   n) anisotropically etching the gate oxide layer underneath the silicon nitride layer down to the substrate surface, with the silicon nitride layer acting as an etching mask, and forming a tunnel window with walls;
   o) thermally oxidizing the exposed substrate surface and the walls of the tunnel window; and
   p) removing the silicon nitride layer.

2. The method according to claim 1, wherein the layer formed over the polysilicon layer in step e) is a silicon nitride layer.

3. A method of producing a gate electrode having a very small width, which comprising the following steps:
   a) producing a silicon oxide-polysilicon oxide layer sandwich on a substrate surface;
   b) producing a first layer on the layer sandwich;
   c) producing a structure with an edge on the first layer;
   d) depositing a second layer over the first layer and the structure, wherein the second layer is etchable selectively with respect to the first layer;
   e) anisotropically etching the second layer and leaving only a microstructure at the edge of the structure;
   f) removing the structure;
   g) forming an oxide layer on the first layer around the microstructure, with the microstructure acting as an oxide barrier;
   h) removing the microstructure;
   i) anisotropically etching the first layer underneath the oxide, and using the oxide layer structured by means of the microstructure as an etching mask;
   j) removing the oxide layer;
   k) anisotropically etching the upper silicon oxide layer of the layer sandwich underneath the first layer, and using the first layer as an etching mask;
   l) removing the first layer;
   m) anisotropically etching the polysilicon layer and the silicon oxide layer of the layer sandwich down to the substrate surface, using the upper silicon oxide layer as an etching mask, and forming a trench with wall surfaces;
   n) thermally oxidizing the substrate surface and the wall surfaces of the trench; and
   o) filling and covering the trench with a polysilicon layer that reaches into the trench and forms a gate electrode.

4. The method according to claim 3, wherein the first layer is a polysilicon layer and the second layer is a silicon nitride layer.

5. The method according to claim 3, wherein the gate electrode is a control electrode in a MOS transistor.

6. The method according to claim 3, wherein the gate electrode is a floating gate in a flash EEPROM memory cell.

* * * * *